(12) United States Patent
Hayashi

(10) Patent No.: US 10,060,322 B2
(45) Date of Patent: Aug. 28, 2018

(54) HONEYCOMB STRUCTURE BODY AND METHOD OF DESIGNING HONEYCOMB STRUCTURE BODY

(71) Applicant: DENSO CORPORATION, Kariya, Aichi-pref. (JP)

(72) Inventor: Naohiro Hayashi, Kariya (JP)

(73) Assignee: DENSO CORPORATION, Kariya (JP)

( * ) Notice: Subject to any disclaimer, the term of this patent is extended or adjusted under 35 U.S.C. 154(b) by 340 days.

(21) Appl. No.: 14/753,444

(22) Filed: Jun. 29, 2015

(65) Prior Publication Data

US 2015/0377109 A1 Dec. 31, 2015

(30) Foreign Application Priority Data

Jun. 30, 2014 (JP) ................................. 2014-133468

(51) Int. Cl.
*F01N 3/28* (2006.01)
*G06F 17/50* (2006.01)

(52) U.S. Cl.
CPC ........... *F01N 3/2828* (2013.01); *G06F 17/50* (2013.01); *F01N 2330/30* (2013.01); *F01N 2330/34* (2013.01); *F01N 2330/48* (2013.01); *F01N 2330/60* (2013.01)

(58) Field of Classification Search
None
See application file for complete search history.

(56) References Cited

U.S. PATENT DOCUMENTS

| 5,952,079 | A | 9/1999 | Andou et al. |
| 6,159,431 | A | 12/2000 | Inoue et al. |
| 2002/0042344 | A1 | 4/2002 | Kondo et al. |
| 2004/0123573 | A1 | 7/2004 | Ichikawa et al. |
| 2007/0294989 | A1 | 12/2007 | Ichikawa |
| 2015/0047307 | A1 | 2/2015 | Hayashi et al. |

FOREIGN PATENT DOCUMENTS

| JP | H10-264125 | 10/1998 |
| JP | H11-277653 | 10/1999 |
| JP | 3060539 | 4/2000 |
| JP | 2002-177794 | 6/2002 |
| JP | 2002-326035 | 11/2002 |
| JP | 2005-120987 | 5/2005 |
| JP | 2006-263947 | 10/2006 |
| JP | 2006-281134 | 10/2006 |
| JP | 2008-018370 | 1/2008 |
| JP | 2008-200605 | 9/2008 |
| JP | 2013-154278 | 8/2013 |

*Primary Examiner* — Nicholas W. Jordan
(74) *Attorney, Agent, or Firm* — Nixon & Vanderhye P.C.

(57) ABSTRACT

A honeycomb structure body has main cells having a tubular shape and main cell walls. Each main cell is surrounded by the main cell walls. A virtual base structure body has base cell walls and base cells. The honeycomb structure body has an improved structure obtained by modifying a structure of the virtual base structure body. Each base intersecting point, at which base cell walls intersect, is determined by a polar coordinate (r, θ) using a radius vector r and a deflection angle θ. Each main intersecting point is formed on a polar coordinate (r', θ) using the deflection angle θ and a main radius vector r' which is obtained by multiplying the radius vector r and a constant magnification without changing the deflection angle θ. A cell density varying section varies its cell density and is formed in at least a part of the honeycomb structure body.

5 Claims, 11 Drawing Sheets

HONEYCOMB STRUCTURE BODY AND METHOD OF DESIGNING HONEYCOMB STRUCTURE BODY

CROSS-REFERENCE TO RELATED APPLICATION

This application is related to and claims priority from Japanese Patent Application No. 2014-133468 filed on Jun. 30, 2014, the contents of which are hereby incorporated by reference.

BACKGROUND OF THE INVENTION

1. Field of the Invention

The present invention relates to honeycomb structure bodies and methods of designing a honeycomb structure body having an improved structure capable of allowing exhaust gas emitted from an internal combustion engine, etc. to flow at a uniform flow speed in overall cells, and to purify exhaust gas with high efficiency.

2. Description of the Related Art

There has been known a catalyst converter equipped with a honeycomb structure body capable of purifying exhaust gas emitted from an internal combustion engine mounted on vehicles, etc. Such a catalyst converter is arranged inside of an exhaust gas pipe connected to an internal combustion engine of a vehicle, for example. In general, the honeycomb structure body has a plurality of cells formed along an axial direction of the honeycomb structure body. Each of the cells is surrounded by cell walls. Each of the cells has a straight tubular shape, and a cross section thereof is a rectangle shape, a hexagonal shape, etc. When exhaust gas having a high temperature emitted from an internal combustion engine passes through the cells of the honeycomb structure body, heat energy of the exhaust gas of a high temperature activates the catalyst supported by the cells, and the activated catalyst purifies the exhaust gas. Purified exhaust gas is discharged outside of the vehicle through the exhaust gas pipe. In general, exhaust gas passes more through a central portion than an outer portion of the honeycomb structure body, viewed in a cross section which is perpendicular to the axial direction of the honeycomb structure body.

For example, a patent document 1, Japanese patent laid open publication No. 2008-18370, discloses such a honeycomb structure body for use in a catalyst converter. The honeycomb structure body disclosed in the patent document 1 has cells and cell walls. Each of the cells is surrounded by the cell walls to make a straight tubular shape. The cells extend along an axial direction of the honeycomb structure body. In particular, the cell walls are formed in a hyperbola arrangement in which the cell walls are arranged along a plurality of hyperbolas as viewed in a cross section perpendicular to the axial direction of the honeycomb structure body. A cell density of the cells per unit area in a cross section, which is perpendicular to the axial direction of the honeycomb structure body, is reduced from a central point to the outer periphery of the honeycomb structure body. This structure increases an exhaust gas flowing area of the cells formed in the outer periphery through which exhaust gas passes, and allows the overall cells to have a uniform flow amount of exhaust gas.

However, the honeycomb structure body disclosed in the patent document 1 causes some problems. For example, because the cell walls are arranged along a plurality of hyperbolas in the honeycomb structure body, a curvature of the hyperbola becomes large at the outer periphery in a radial direction of the honeycomb structure body. This causes deformation of the cells formed in the outer periphery. The more a cell density of the cells formed in the outer periphery becomes small, the more the distortion in shape of the cells formed in the outer periphery increases. The generation of distortion in shape of the cells reduces the strength of the honeycomb structure body, and causes the exhaust gas to have non-uniform flow speed in the overall cells in the honeycomb structure body.

SUMMARY

It is therefore desired to provide a honeycomb structure body and a method of designing a honeycomb structure body having an improved structure capable of suppressing distortion in shape of cells, allowing exhaust gas to flow at a uniform flow speed in the overall cells, and increasing exhaust gas purification capability.

An exemplary embodiment provides a method of designing a honeycomb structure body. The honeycomb structure body has a plurality of cells. Exhaust gas passes in the cells having a tubular shape. Each of the cells is surrounded by cell walls. The method has a step of designing a virtual base structure body, a step of forming a main intersecting points, and a step of forming a plurality of main cell walls. The virtual base structure body has a plurality of base cell walls and base cells. Each of the base cells is surrounded by the base cell walls so that the virtual base structure body has a uniform cell density per unit area in a cross section which is perpendicular to an axial direction of the virtual base structure body. The cell density indicates the number of the base cells per unit area.

A polar coordinate (r, θ) indicates each of base intersecting points at which the base cell walls cross each other when viewed from the axial direction of the virtual base structure body. The polar coordinate (r, θ) is designated using a deflection angle (θ) and a radius vector (r) measured from a central point of the virtual base structure body. The polar coordinate (r, θ) has a main radius vector (r') and the deflection angle (θ). The main radius vector (r') is obtained by multiplying the radius vector (r) and a constant magnification without varying the deflection angle (θ) in the base intersecting points having a same radius vector (r). The main intersecting points corresponding to the base intersecting points are connected together by the main cell walls to form a plurality of the main cells surrounded by the main cell walls. In particular, a cell density varying section, as a first cell density varying section, is formed in at least a part of the main cells, where a cell density of the main cells formed in the cell density varying section is reduced from the central point to an outer periphery of the honeycomb structure body.

In accordance with another aspect of the present invention, there is provided a honeycomb structure body. The honeycomb structure body has a plurality of cells and a plurality of cell walls. Each of the cells has a tubular shape. Exhaust gas passes through the cells having a tubular shape. Each of the cells is surrounded by the cell walls. A virtual base structure body has a plurality of base cell walls and base cells. Each of the base cells is surrounded by the base cell walls so that the virtual base structure body has a uniform cell density per unit area in a cross section. The cross section is perpendicular to an axial direction of the virtual base structure body. The cell density indicates the number of the base cells per unit area. A polar coordinate (r, θ) indicates each of base intersecting points at which the base cell walls cross each other when viewed from the axial direction of the virtual base structure body. The polar coordinate (r, θ) is designated using a deflection angle (θ) and a radius vector (r) measured from a central point of the virtual base structure body. Main intersecting points are formed on the polar coordinate (r, θ). The polar coordinate (r, θ) has a main radius vector (r') and the deflection angle (θ), where the main radius vector (r') is obtained by multiplying the radius vector (r) and a constant magnification without varying the deflection angle (θ) in the base intersecting points having a same radius vector (r). Each of the cells is surrounded by the cell walls. The main intersecting points corresponding to the base intersecting points are connected together, to form a plurality of the main cells surrounded by the main cell walls. A cell density varying section as a first cell density varying section is formed in at least a part of the main cells, where a cell density of the main cells in the cell density varying section is reduced from the central point to an outer periphery of the honeycomb structure body.

In general, a honeycomb structure body having a plurality of cells uniformly arranged therein has the following problem. The outer portion has a reduced flow speed of exhaust gas as compared with the inner portion in a cross section which is perpendicular to an axial direction of the honeycomb structure body. That is, the further the portion from the central point of the honeycomb structure body, the more the flow speed of exhaust gas decreases. The cells formed in the outer portion causes this phenomenon more as compared with the cells formed in the inner portion in the honeycomb structure body. Further, variation of the flow speed of exhaust gas increases more in the cells formed in the outer portion as compared with the cells formed in the inner portion.

In order to solve the problem and phenomenon previously described, the method according to an exemplary embodiment of the present invention designs, i.e. forms the cell density varying section, as the first cell density varying section, in at least a part of the honeycomb structure body. That is, the method designs, i.e. forms the honeycomb structure body having an improved structure in which a cell density in the cell density varying section is gradually decreased from a center point side to the outer periphery of the honeycomb structure body because a flow speed of exhaust gas reduces in the portion far from the central point. On the other hand, a flow speed of exhaust gas becomes high in the cells formed in the central portion when viewed in a cross section of the honeycomb structure body. Accordingly, it is possible to increase a cross sectional area of the flow passage in the cells formed in the cell density varying section according to approaching the outer periphery from the central point side in a radial direction of the honeycomb structure body. This improved structure of the honeycomb structure body allows exhaust gas to flow at a uniform flow speed or a uniform flow speed across the honeycomb structure body, i.e. throughout all of the cells. It is possible for each of the cells to have a straight tubular shape and a cross section of each of the cells to have a square shape, a hexagonal shape, or another shape.

In addition, the method designs and forms the positions of the main intersecting points in the honeycomb structure body on the basis of the results of multiplying the radius vector (r) and the constant magnification, using the virtual base structure body having a uniform cell density, without varying the deflection angle (θ) on the base intersecting points having the same radius vectors. As previously described, it is possible to suppress distortion in shape of the cells when the cell density is varied in a radial direction of the honeycomb structure body.

It is therefore possible for the present invention to provide the honeycomb structure body and the method capable of designing the honeycomb structure body while suppressing distortion in shape of the cells. Exhaust gas can pass through the obtained honeycomb structure body at a uniform flow speed and be purified with high efficiency.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
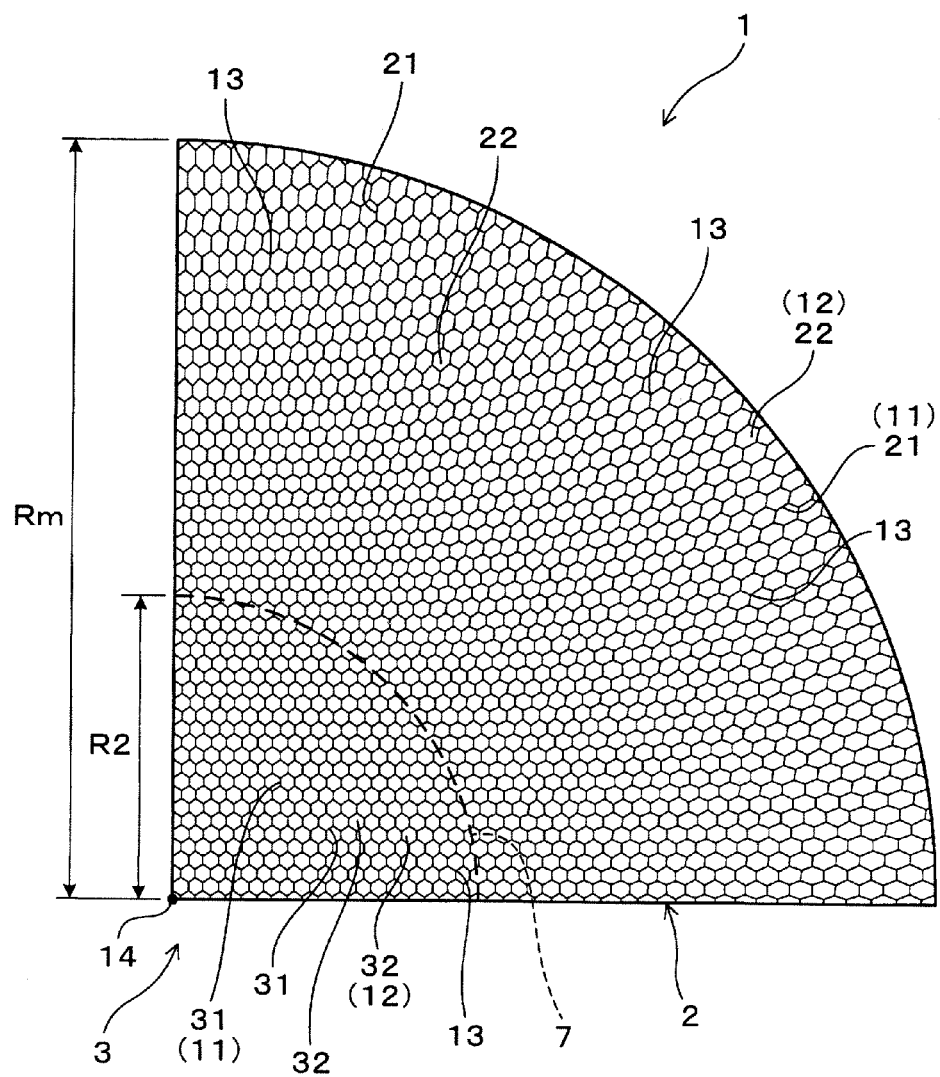
FIG. 1 is a cross sectional view showing a structure of a honeycomb structure body, in a radius direction perpendicular to an axial direction of the honeycomb structure body, according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

It is preferable to determine the main radius vector r' by a function using the radius vector r used in the polar coordinate (r, θ) of the main intersecting points. This makes it possible for the function to easily calculate the main radius vector r' on the basis of the radius vector r. In addition, it is possible to easily vary a cell density of the main cells in the cell density varying section (as the first cell density varying section) by changing parameters of the function.

The honeycomb structure body according to the present invention is arranged in the inside of an exhaust gas pipe. The exhaust gas pipe is connected to an internal combustion engine. The exhaust gas pipe is composed of an upstream side pipe, an arrangement pipe, and a downstream side pipe. The arrangement pipe is arranged between the upstream side pipe and the downstream side pipe to communicate with them. In particular, the arrangement pipe has a diameter which is larger than that of the upstream side pipe. A catalyst converter is equipped with the honeycomb structure body according to an exemplary embodiment of the present invention. The honeycomb structure body 1 is arranged in the inside of the arrangement pipe. The exhaust gas emitted from the internal combustion engine passes through the upstream side pipe. The catalyst supported in the honeycomb structure body purifies the exhaust gas when the exhaust gas passes through the catalyst converter. The purified exhaust gas passes through the downstream pipe and is discharged outside.

In particular, the honeycomb structure body according to the exemplary embodiment of the present invention has an inside structure section and the cell density varying section (as a first cell density varying section). The inside structure section is formed in the inside in a radius direction of the honeycomb structure body. The cells are arranged in a constant cell density in the inside structure section. The cell density varying section is formed outside of the inside structure section.

In the honeycomb structure body, a boundary layer formed between the inside structure section and the cell density varying section has a radius R2 (a boundary radius R2). It is preferable for the honeycomb structure body to satisfy the relationship of $R1-\delta \leq R2 \leq 1.05\, R1$, where R1 indicates a radius of a flow passage of the upstream side pipe, δ indicates a thickness of a boundary area of exhaust gas having a flow speed of not more than 99%, formed between the upstream side pipe and the exhaust gas when exhaust gas flows in the inside of the upstream side pipe, and R2 indicates the boundary radius of the boundary layer (see FIG. 1, for example). By the way, Rm indicates an outer radius of the honeycomb structure body. This structure makes it possible to arrange the cell density varying section (as the first cell density varying section) in the honeycomb structure body in the optimum location which allows exhaust gas to flow at a uniform flow speed in the overall cells in the honeycomb structure body.

It is preferable to further form an additional cell density varying section as a second cell density varying section outside the first cell density varying section. The cell density of the cells formed in the second cell density varying section increases from the central point side to the outer periphery side of the honeycomb structure body.

First Exemplary Embodiment

A description will now be given of the honeycomb structure body and the method of designing a structure of the honeycomb structure body according to a first exemplary embodiment with reference to FIG. 1 to FIG. 5.

FIG. 1 is a cross sectional view showing a structure of the honeycomb structure body 1 according to the first exemplary embodiment in a radius direction which is perpendicular to an axial direction of the honeycomb structure body 1.

As shown in FIG. 1, the honeycomb structure body 1 according to the first exemplary embodiment has a plurality of cell walls 11, 21, 31 and a plurality of cells 12, 22, 32. Each of the cells 12, 22, 32 is surrounded by the cell walls. Although each of the cells 12, 22, 32 has a straight tubular shape, and a cross section of each has a hexagonal shape shown in FIG. 1, it is acceptable for each of the cells 12, 22, 32 to have a cross section of another shape, for example, a circular shape, a rectangle shape, a square shape, etc. The cross section of each of the cells 12, 22, 32 is perpendicular to an axial direction of the honeycomb structure body 1. When exhaust gas emitted from an internal combustion engine such as a diesel engine (not shown) passes through each of the cells 12, 22, 32 having a hexagonal tubular shape in the honeycomb structure body 1, the exhaust gas is purified by catalyst supported in the honeycomb structure body 1. The purified exhaust gas is discharged outside of the exhaust gas pipe 60.

Figure 2:
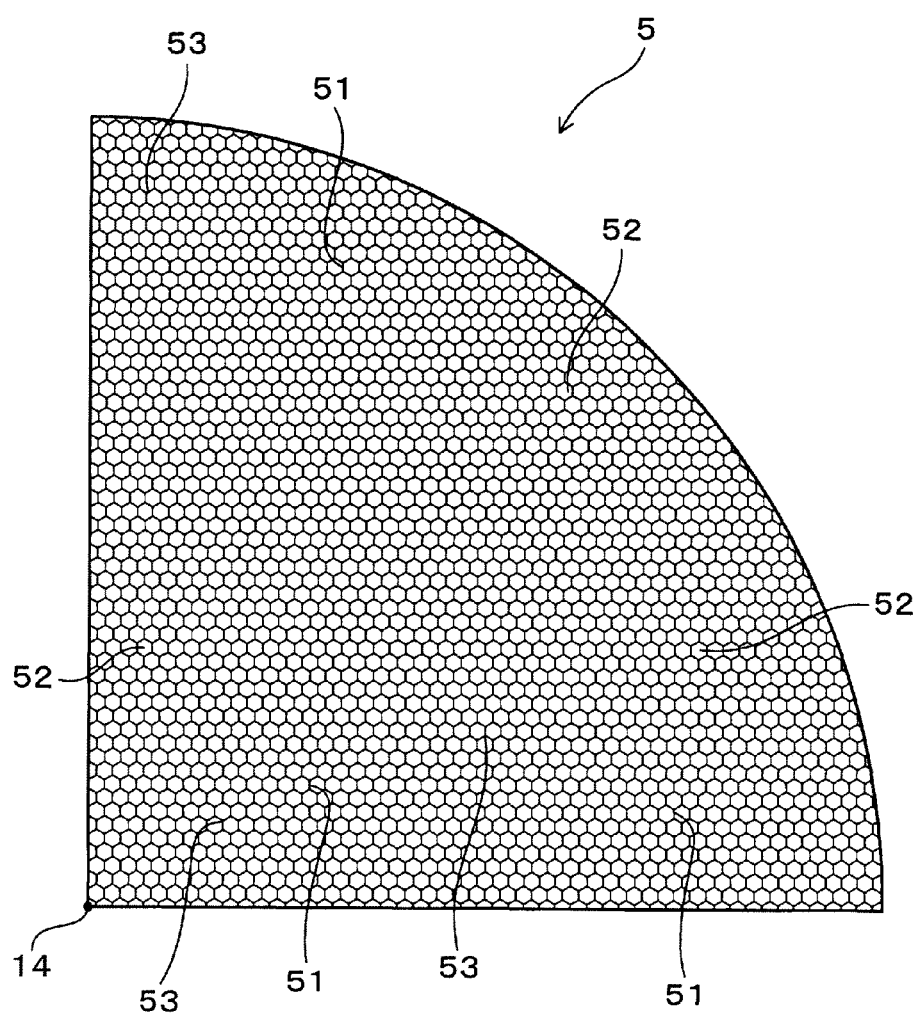
FIG. 2 is a cross sectional view showing a virtual structure of a virtual base structure body, in a radius direction perpendicular to an axial direction of the virtual base structure body, to be used for designing and producing the honeycomb structure body 1 according to the first exemplary embodiment of the present invention shown in FIG. 1.

FIG. 2 is a cross sectional view showing a virtual structure of a virtual base structure body 5, in a radius direction perpendicular to an axial direction of the virtual base structure body 5. This virtual base structure body 5 is used for designing and forming the honeycomb structure body 1 according to the first exemplary embodiment shown in FIG. 1. The virtual base structure body 5 has a plurality of base cell walls 51 and a plurality of base cells 52. Each of the base cells 52 is surrounded by the base cell walls 51. In particular, the base cells 52 are formed to have a uniform cell density, i.e. a constant cell density or a same cell density across the area of the virtual base structure body 5.

Figure 4:
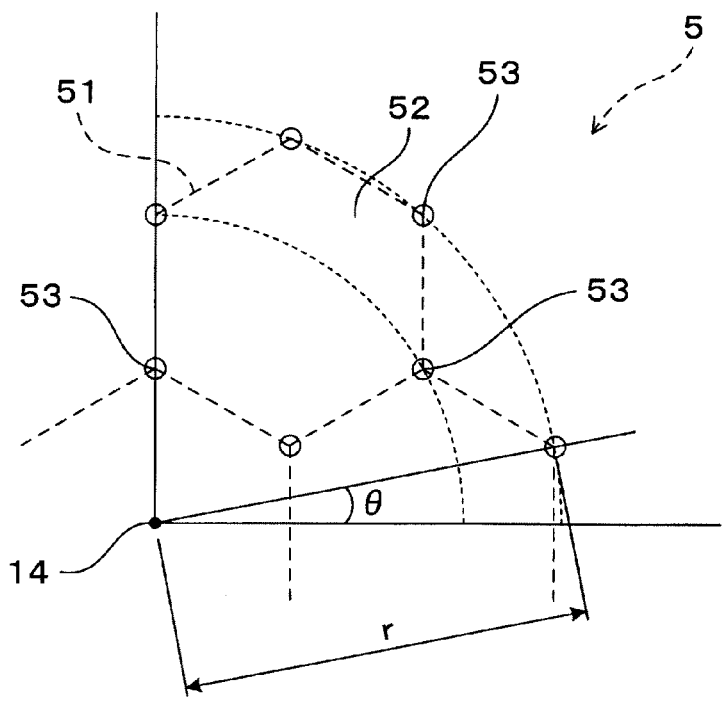
FIG. 4 is a view explaining a structure of the virtual base structure body, on the basis of which the method according to the present invention designs and forms the honeycomb structure body according to the first exemplary embodiment of the present invention.

FIG. 4 is a view explaining a structure of the virtual base structure body 5. The method according to the first exemplary embodiment designs and produces the honeycomb structure body 1 on the basis of the structure of the virtual base structure body 5 shown in FIG. 2 and FIG. 4. As shown in FIG. 2 and FIG. 4, when viewed from an axial direction of the virtual base structure body 5, each of a plurality of base intersecting points 53 can be expressed in a polar coordinate (r, θ) using a radius vector r and a deflection angle θ, where the base cell walls 51 cross each other at the base intersecting points 53, and the virtual base structure body 5 has a central point 14.

Figure 5:
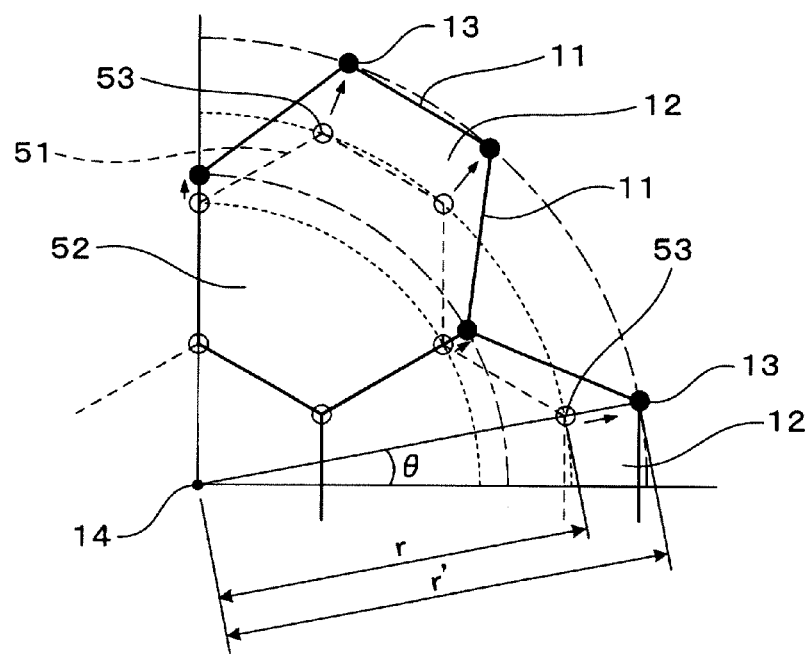
FIG. 5 is a partially enlarged view showing a structure of the honeycomb structure body formed by modifying the virtual base structure body according to the first exemplary embodiment of the present invention.

FIG. 5 is a partially enlarged view showing a structure of the honeycomb structure body 1 formed by modifying the virtual base structure body 5 according to the first exemplary embodiment.

As shown in FIG. 4 and FIG. 5, main intersecting points 13 are formed on a polar coordinate (r', θ) using a main radius vector r' and the deflection angle θ, without changing a magnitude of the deflection angle θ, on the basis of the base intersecting points 53 having a same radius vector r. In particular, the main radius vector r' is obtained by multiplying the radius vector r and a constant magnification without varying the deflection angle θ.

Figure 3:
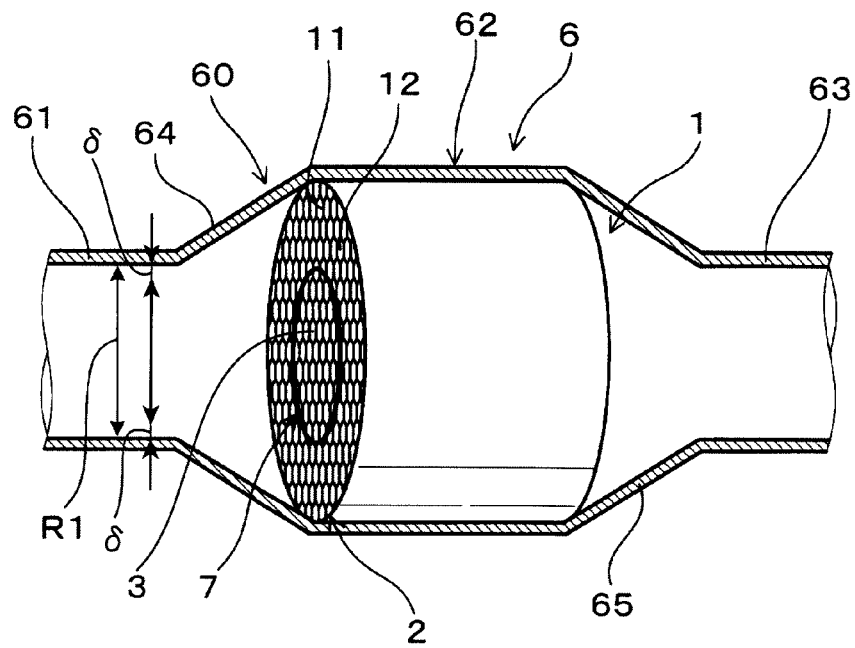
FIG. 3 is a view showing a catalyst converter equipped with the honeycomb structure body according to the first exemplary embodiment of the present invention.

As shown in FIG. 3 and FIG. 5, the honeycomb structure body 1 according to the first exemplary embodiment has a plurality of the main cell walls 11, 21, 31 (or the cell walls 11, 21, 31) and a plurality of the main cells 12, 22, 32 (the cells 12, 22, 32). Each of the main cells 12, 22, 32 is surrounded by the main cell walls. Each of the main cells 12, 22, 32 has a straight tubular shape and a cross section of which has a hexagonal shape.

Each of the main cell walls 11 connects the main intersecting points 13 corresponding to each of the base intersecting points 53 at which the base cell walls 51 are connected together.

A cell density varying section 2, i.e. a first cell density section 2 is formed in at least a part of the honeycomb structure body 1. In the cell density of the main cells 12 formed in the first cell density varying section 2 is reduced from the central point 14 side to the outer periphery side.

A description will now be given of the structure of the honeycomb structure body 1 according to the first exemplary embodiment. FIG. 3 is a view showing a catalyst converter 6 equipped with the honeycomb structure body 1 according to the first exemplary embodiment. As shown in FIG. 3, the honeycomb structure body 1 is arranged in the catalyst converter 6 in order to purify exhaust gas emitted from an internal combustion engine (not shown) such as a diesel engine mounted on a motor vehicle. The internal combustion engine (not shown) is connected to an exhaust gas passage. That is, such exhaust gas emitted from the internal combustion engine is discharged to the exhaust gas passage. The exhaust gas passage has an exhaust gas pipe 60 (see FIG. 3, for example). The exhaust gas is introduced into the inside of the main cells 12 formed in the honeycomb structure body 1, and catalyst supported by the main cells 12 purifies the exhaust gas. The purified exhaust gas is discharged outside the exhaust gas pipe 60.

The honeycomb structure body 1 and the exhaust gas pipe 60 form the catalyst converter 6. The exhaust gas pipe 60 is a part of the exhaust gas passage connected to the internal combustion engine previously explained.

As clearly shown in FIG. 3, the exhaust gas pipe 60 consists of an upstream side pipe 61, the arrangement pipe 62 and a downstream side pipe 63. The upstream side pipe 61 is arranged at an upstream side (at the internal combustion engine side) of the exhaust gas pipe 60. The downstream side pipe 63 is arranged at a downstream side of the exhaust gas pipe 60. The honeycomb structure body 1 is arranged inside of the exhaust gas pipe 60.

As shown in FIG. 3, it is formed for the arrangement pipe 62 to have a diameter which is larger than a diameter of each of the upstream side pipe 61 and the downstream side pipe 63. The arrangement pipe 62 accommodates the honeycomb structure body 1.

An upstream side cone section 64 is arranged between the upstream side pipe 61 and the arrangement pipe 62. The upstream side cone section 64 has a diameter which gradually increases from the diameter of the upstream side pipe 61 to the diameter of the arrangement pipe 62. Furthermore, a downstream side cone section 65 is arranged between the arrangement pipe 62 and the downstream side pipe 63. The downstream side cone section 65 has a diameter which gradually decreases from the diameter of the arrangement pipe 62 to the diameter of the downstream side pipe 63.

The upstream side pipe 61 has a cylindrical shape. The upstream side pipe 61 and the upstream side cone section 64 connected to the arrangement pipe 62 are linearly arranged so that a central axis of the upstream side pipe 61 and a central axis of the upstream side cone section 64 make a coaxial structure. In the first exemplary embodiment, an effective diameter R1 of the upstream side pipe 61 through which exhaust gas flows is 28.5 mm.

Similar to the upstream side pipe 61, the downstream side pipe 63 has a cylindrical shape. The downstream side cone section 65 and the downstream side pipe 63 are linearly arranged so that a central axis of the downstream side cone section 65 and a central axis of the downstream side pipe 63 make a coaxial structure.

As shown in FIG. 1 and FIG. 3, the honeycomb structure body 1 is composed of catalyst and a ceramic support body having a cylindrical shape. The ceramic support body supports the catalyst therein. In more detail, the honeycomb structure body 1 has the main cell walls 11 arranged in a lattice arrangement and the main cells 12. Each of the main cells 12 is surrounded by the main cell walls 11. For example, each of the main cells 12 has a tubular and hexagonal shape. Further, an outer peripheral wall having a cylindrical shape is formed on the surface of the honeycomb structure body 1. For example, the outermost peripheral wall of the honeycomb structure body 1 has a radius Rm of 51.5 mm.

The honeycomb structure body 1 has an inside structure section 3 and the first cell density varying section 2. The inside structure section 3 is formed radially inside a cross section which is perpendicular to an axial direction of the honeycomb structure body 1. On the other hand, the first cell density varying section 2 is formed radially outside the cross section of the honeycomb structure body 1. As shown in FIG. 1, the first cell density varying section 2 is formed between the outer periphery of the inside structure section 3 to the outermost periphery of the honeycomb structure body 1.

The inside structure section 3 has a cylindrical shape, and is composed of a plurality of main cell walls 31 arranged in a lattice arrangement and main cells 32. Each of the main cells 32 is surrounded by the main cell walls 31. For example, each of the main cells 32 has a tubular hexagonal shape. Further, a cross section of each of the main cells 32 in the inside structure section 3 has a hexagonal shape. The inside structure section 3 has a constant cell density.

The first cell density varying section 2 has a cylindrical shape. The inside structure section 3 is formed in the inside of the first cell density varying section 2. The first cell density varying section 2 is composed of a plurality of main cell walls 21 and main cells 22. The main cell walls 21 in the first cell density varying section 2 are arranged in a lattice arrangement. Each of the main cells 22 in the first cell density varying section 2 is surrounded by the main cell walls 21 and has a tubular hexagonal shape. Further, a cross section of each of the main cells 32 in the inside structure section 3 has a hexagonal shape. A boundary layer 7 (designated by the dotted line in FIG. 1) between the inside structure section 3 and the first cell density varying section 2 has a boundary radius R2 of 20 mm.

The structure of the honeycomb structure body 1 according to the first exemplary embodiment has the structure which satisfies a relationship of $R1-\delta <= R2 <= 1.05\ R1$, where Rm indicates an outer radius of the honeycomb structure body 1, R1 indicates a radius of a flow passage of the upstream side pipe 61, δ indicates a thickness of a boundary area of exhaust gas having a flow speed of not more than 99%, formed between the upstream side pipe 61 and the exhaust gas when exhaust gas flows in the inside of the upstream side pipe 61, and R2 indicates the boundary radius of the boundary layer 7 formed between the inside structure section 3 and the first cell density varying section 2.

The boundary area of exhaust gas is strongly affected by the viscosity of exhaust gas when the exhaust gas passes through the upstream side pipe 61. For example, it is possible to calculate the thickness δ of the boundary area of exhaust gas having a flow speed of not more than 99%, formed between the upstream side pipe 61 and the exhaust gas by using the following equation:

$$\delta = 0.371(\mu/\rho Ux)^{1/5}x,$$

where ρ indicates a density of exhaust gas, μ indicates a viscosity coefficient of exhaust gas, U is a flow speed of exhaust gas, x indicates a straight length from the upstream side pipe 61 to the upstream side cone section 64. The upstream side cone section 64 is arranged between the upstream side pipe 61 and the arrangement pipe 62. The honeycomb structure body 1 according to the first exemplary embodiment has δ=10.

A description will now be given of the method of designing and forming the honeycomb structure body 1 according to the first exemplary embodiment.

As shown in FIG. 2 and FIG. 4, the virtual base structure body 5 is designed by using a computer aided design (CAD) system, etc.

The virtual base structure body 5 has a plurality of the base cell walls 51 and a plurality of the base cells 52. Each of the base cells 52 is surrounded by the base cell walls 51. Each of the base cells 52 has a hexagonal tubular shape. In particular, the base cells 52 are formed to have a uniform cell density, i.e. a constant cell density of 116 cells/cm².

Each of a plurality of the base intersecting points 53 is expressed in a polar coordinate (r, θ) using a radius vector r and a deflection angle θ, where base cell walls 51 cross each other at the base intersecting points 53, and the virtual base structure body 5 has the central point 14. The radius vector r indicates a distance between the central point 14 and the base intersecting point 53. The deflection angle θ indicates an inclination angle of a straight line which connects the central point 14 with the radius vector r. In the structure of the honeycomb structure body 1 according to the first exemplary embodiment, the inclination angle θ is determined by a reference line parallel to a horizontal line passing through the central point 14 and the straight line which connects the central point 14 with the radius vector r.

As shown in FIG. 5, the main intersecting point 13 is formed on the basis of the base intersecting points 53. The main intersecting point 13 is formed on a polar coordinate (r', θ) using a main radius vector r' and the deflection angle θ which is the deflection angle θ used by the base intersecting point 53, i.e. without changing a magnitude of the deflection angle θ. In particular, the main radius vector r' is obtained by multiplying the radius vector r used by the base intersecting point 53 and a constant magnification without varying the deflection angle θ.

In the inside structure section 3, this constant magnification has a value of 1. That is, the main intersecting point 13 is equal in position to the base intersecting point 53.

The main intersecting point 13 in the first cell density varying section 2, which is arranged outside of the boundary layer 7 having the boundary radius R2 in a radial direction, is obtained by multiplying the radius vector r used by the base intersecting point 53 having the same radius vector r and a constant magnification value Z. The magnification value Z is obtained by the following sixth-degree function:

$$Z = ar^6 - br^5 + cr^4 - dr^3 + er^2 - fr + g.$$

Further, it is possible to calculate the main radius vector r' by the equation of r'=rZ.

It is possible to change each parameter, i.e. each of the constant values a, b, c, d, e, f and g used in the 6th-degre function previously described.

As shown in FIG. 1 and FIG. 5, the main cell walls 11 are formed to connect the main intersecting points 13 together.

The main cell walls 11 are formed to connect the main intersecting point 13 corresponding to the base intersecting point 53 at which the base cell walls 51 are connected together. This makes it possible to form each of the main cells 12 surrounded by the main cell walls 11. Further, the main cells 32 as the inner main cells 32 are formed in the inside structure section 3 to have a constant cell density. The main cells 21 as the outer main cells are formed in the first cell density varying section 2 to have a cell density which is reduced to the outermost side of the first cell density varying section 2 in the honeycomb structure body 1.

Next, a description will now be given of the action and effects of the honeycomb structure body 1 and the method of designing the honeycomb structure body 1 according to the first exemplary embodiment.

There is a tendency of lowering a flow speed of exhaust gas in an outer portion, as compared with an inner portion, in radial direction of a conventional honeycomb structure body, in which the overall cells are arranged in a constant cell density. When a catalyst converter is equipped with the conventional honeycomb structure body having the structure previously described, the flow speed of exhaust gas is slowed more in the cells far from the central point side in the radial direction. Further, the variation of the flow speed of exhaust gas in the outer portion becomes larger than that in the inner portion of the honeycomb structure body having the conventional structure. In order to solve the problem previously described and to have the uniform flow speed in the cells of the honeycomb structure body 1, the method according to the first exemplary embodiment forms the first cell density varying section 2 in at least a part of the honeycomb structure body 1. The honeycomb structure body 1 according to the first exemplary embodiment has an improved structure in which a cell density of the cells is reduced from the central point to the outer periphery side while considering the fact in which the radially outer portion has a relatively low flow speed, and the variation of the flow speed of exhaust gas becomes large in an area far from the central point side in a radial direction of the honeycomb structure body 1. Accordingly, a cross sectional area of a flow passage of the cells 22 is more increased in a radially outside portion in the first cell density varying section 2. This structure allows the overall cells in the honeycomb structure body 1 to have a uniform flow speed or a uniform flow speed of exhaust gas.

The method according to the first exemplary embodiment determines the main intersecting points 13 on the basis of the virtual base structure body 5 having a same cell density, without changing a magnitude of the deflection angle θ at the base intersecting point 53 having the same radius vector r, where the main radius vector r' is obtained by multiplying the radius vector r used by the base intersecting point 53 and a constant magnification without varying the deflection angle θ. This structure makes it possible to suppress distortion in shape of the main cells 12 by changing the radius vector r only, when a cell density of the cells is varied in the honeycomb structure body 1.

Further, the main radius vector r' of the main intersecting point 13 is determined on the basis of the function using the radius vector r in the polar coordinate (r, θ) of the base intersecting point 53. It is therefore possible to easily calculate the main radius vector r' of the main intersecting point 13 by the function using the radius vector r in the polar coordinate (r, θ) of the base intersecting point 53. Furthermore, it is possible to easily vary the cell density of the main cells 12 in the first cell density varying section 2 by changing such parameters of the function.

The honeycomb structure body 1 according to the first exemplary embodiment is arranged in the inside of an exhaust gas pipe. The exhaust gas pipe is connected to an internal combustion engine (not shown) of a vehicle (not shown). The exhaust gas pipe is composed of the upstream side pipe 61, the arrangement pipe 62, and the downstream side pipe 53. The arrangement pipe 62 is arranged between the upstream side pipe 61 and the downstream side pipe 63 to communicate with them. In particular, the arrangement pipe 62 has a diameter which is larger than that of the upstream side pipe 61. The catalyst converter 6 shown in FIG. 3 is equipped with the honeycomb structure body 1 according to the first exemplary embodiment. The honeycomb structure body 1 is arranged inside of the arrangement pipe 62. The exhaust gas emitted from the internal combustion engine passes through the upstream side pipe 61. The catalyst supported in the honeycomb structure body 1 purifies the exhaust gas when the exhaust gas passes through the catalyst converter 6. The purified exhaust gas is discharged outside through the downstream pipe 63. In particular, the honeycomb structure body 1 according to the first exemplary embodiment has the inside structure section 3 and the first cell density varying section 2. The inside structure section 3 is formed inside in a radius direction of the honeycomb structure body 1. The cells 12, 22, 32 are arranged in a constant cell density in the inside structure section 3. The first cell density varying section 2 is formed outside of the inside structure section 3. The boundary layer 7 formed between the inside structure section 3 and the first cell density varying section 2 has a radius R2 (a boundary radius R2). It is preferable for the honeycomb structure body to satisfy the relationship of R1−δ<=R2<=1.05 R1, where R1 indicates a radius of a flow passage of the upstream side pipe 61, δ indicates a thickness of a boundary area of exhaust gas having a flow speed of not more than 99%, formed between the upstream side pipe 61 and the exhaust gas when exhaust gas flows in the inside of the upstream side pipe 61, and R2 indicates the boundary radius of the boundary layer 7 in the honeycomb structure body 1. By the way, Rm indicates an outer radius of the honeycomb structure body 1. This structure makes it possible to arrange the first cell density varying section 2 in the honeycomb structure body 1 in the optimum location, which allows exhaust gas to flow at a uniform flow speed in the overall cells in the honeycomb structure body 1, while considering the influence of the shape and location of the exhaust gas pipe 60.

As previously described, the method according to the first exemplary embodiment designs and produces the honeycomb structure body 1 which allows exhaust gas to pass at a uniform flow speed, i.e. a uniform flow speed in the overall cells of the honeycomb structure body 1, and capable of purifying exhaust gas with high efficiency.

First Recognition Experiment

Figure 6:
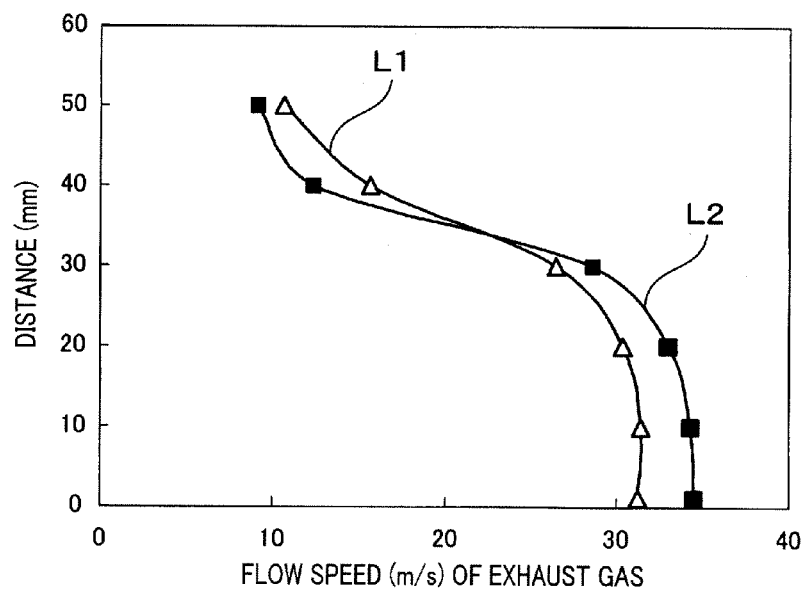
FIG. 6 is a view showing a recognition experiment regarding a relationship between a distance measured from an central point of the honeycomb structure body and a flow speed of exhaust gas.

FIG. 6 is a view showing a recognition experiment regarding a relationship between a distance measured from the central point 41 of the honeycomb structure body 1 and a flow speed of exhaust gas.

As shown in FIG. 6, the first recognition experiment detected a distribution of a flow speed of exhaust gas in test samples and comparative examples. Each of the test samples has the same structure as the honeycomb structure body 1 according to the first exemplary embodiment. On the other hand, each of the comparative samples has the honeycomb structure body in which the overall cells have the same cell density, i.e. the cells are arranged in a same cell density. The cells in each of the comparative samples have the same cell shape and the same cell density of the cells in the inside structure section 3 of the honeycomb structure body 1. Each of the test samples and the comparative samples has an axial length of 105 mm parallel to a longitudinal direction thereof.

In the recognition experiment, each of the test samples and the comparative samples was disposed in the exhaust gas pipe 60 (see FIG. 3). The exhaust gas pipe 60 has been explained in the description of the first exemplary embodiment. Exhaust gas having a temperature of 600° C. flowed at a flow speed of 60 g/second through the exhaust gas pipe 60. At this time, a flow speed of exhaust gas was detected at six detection points, i.e. 0 mm, 10 mm, 20 mm, 30 mm, 40 mm, and 50 mm measured in a radial direction from the central point 14 of each sample.

FIG. 6 shows a graph of a flow speed of exhaust gas in each sample. In FIG. 6, the vertical axis indicates a distance measured from the central point 14 and the horizontal axis indicates the flow speed of exhaust gas. The solid line L1 indicates a flow speed of exhaust gas in each test sample, and the solid line L2 indicates a flow speed of exhaust gas in each comparative sample.

As clearly shown in FIG. 6, the solid line L1 shows that a difference between the maximum flow speed and the minimum flow speed in each test sample is smaller than that in each comparative sample. This means that the test samples having the structure according to the present invention allow exhaust gas to flow at a uniform flow speed in the overall cells, as compared with the comparative samples.

Further, it is recognized that variation in flow speed of exhaust gas becomes small in the inside area within the range of not more than 30 mm measured in a radial direction from the central point 14 as shown in the solid line L1 and the solid line L2. It is further recognized that the variation in flow speed of exhaust gas becomes large in the outside area of more than 30 mm measured from the central point 14 as shown in the solid line L1 and the solid line L2. That is, the area of more than 1.05 R1, measured from the central point 14 in each sample, has a large variation in flow speed of exhaust gas, where R1 indicates the radius of the flow passage of the upstream side pipe 61.

Second Exemplary Embodiment

A description will be given of the structure of the honeycomb structure body 1 according to the second exemplary embodiment with reference to FIG. 7 and FIG. 8.

Figure 7:
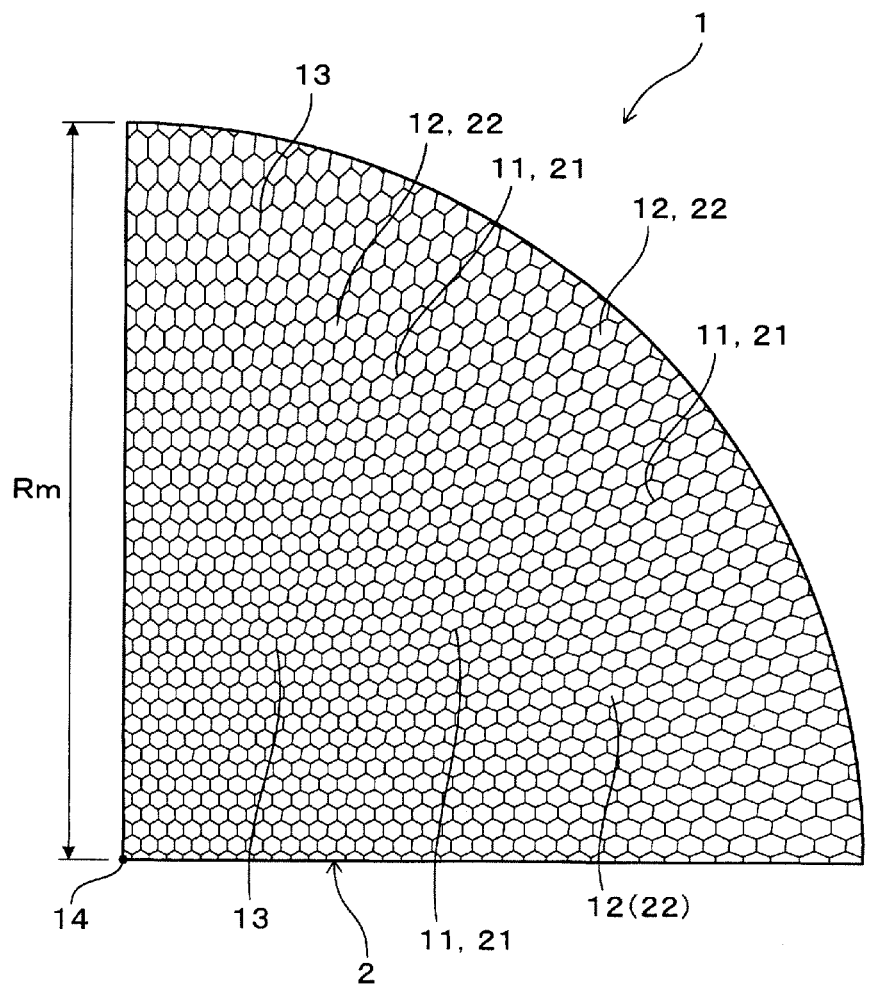
FIG. 7 is a cross sectional view showing a structure of a honeycomb structure body according to a second exemplary embodiment of the present invention.

FIG. 7 is a cross sectional view showing a structure of a honeycomb structure body according to the second exemplary embodiment. FIG. 8 is a cross sectional view showing a structure of a base structure body to be used in the second exemplary embodiment.

Figure 8:
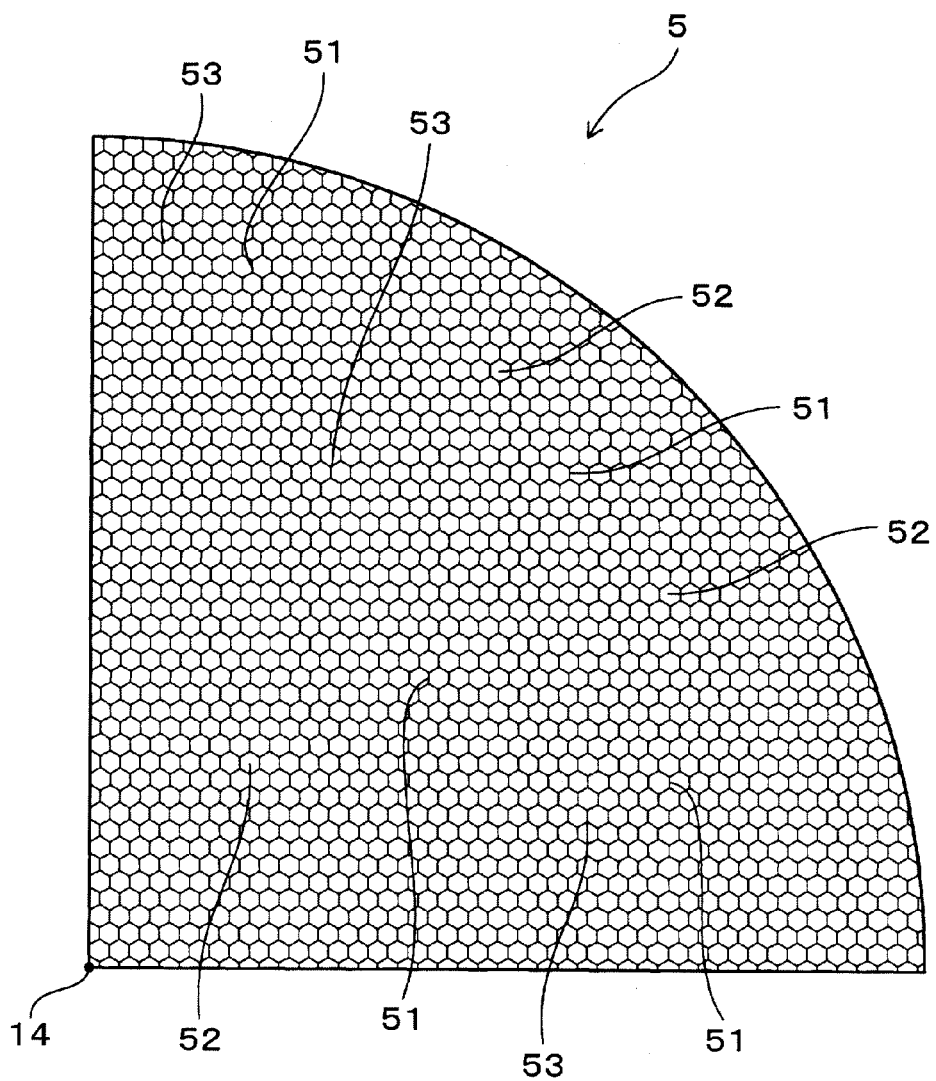
FIG. 8 is a cross sectional view showing a structure of a base structure body to be used in the second exemplary embodiment of the present invention.

As shown in FIG. 7 and FIG. 8, the honeycomb structure body 1 according to the second exemplary embodiment has a structure which is obtained by modifying the structural of the honeycomb structure body 1 according to the first exemplary embodiment. That is, the overall cells in the honeycomb structure body 1 according to the second exemplary embodiment are formed in the first cell density varying section 2 only.

The virtual base structure body 5 shown in FIG. 8 has the base cells 52 having a hexagonal tubular shape and the base cells 52 have a cell density of 81 cells/cm².

In the first cell density varying section 2 shown in FIG. 7, the main intersecting point 13 is obtained by multiplying the radius vector r used by the base intersecting point 53 having the same radius vector r and a magnification value Z. The magnification value Z is obtained by the 4th-degree function of $Z = ar^4 - br^3 + cr^2 - dr + e$.

Other components in the honeycomb structure body 1 according to the second exemplary embodiment have the same structure as those in the honeycomb structure body 1 according to the first exemplary embodiment. The explanation of the same components is omitted here for brevity.

The structure of the honeycomb structure body 1 according to the second exemplary embodiment allows exhaust gas to flow at a uniform flow speed or a uniform flow speed in the overall cells with high efficiency without increasing a difference in flow speed of exhaust gas in the overall cells, i.e. varying a flow speed of exhaust gas along a radial direction from the central point side to the outer periphery side of the honeycomb structure body. The honeycomb structure body 1 according to the second exemplary embodiment has the same action and effects of the honeycomb structure body 1 according to the first exemplary embodiment.

Third Exemplary Embodiment

A description will be given of the honeycomb structure body 1 according to a third exemplary embodiment.

Figure 9:
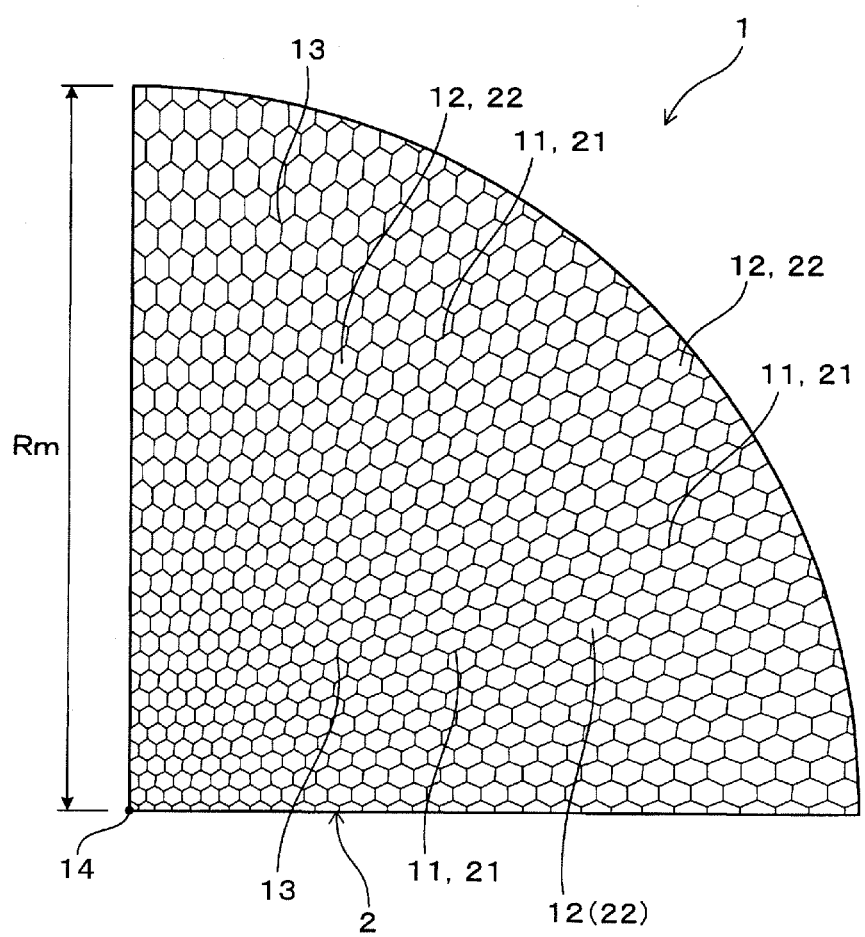
FIG. 9 is a cross sectional view showing a structure of a honeycomb structure body according to a third exemplary embodiment of the present invention.
Figure 10:
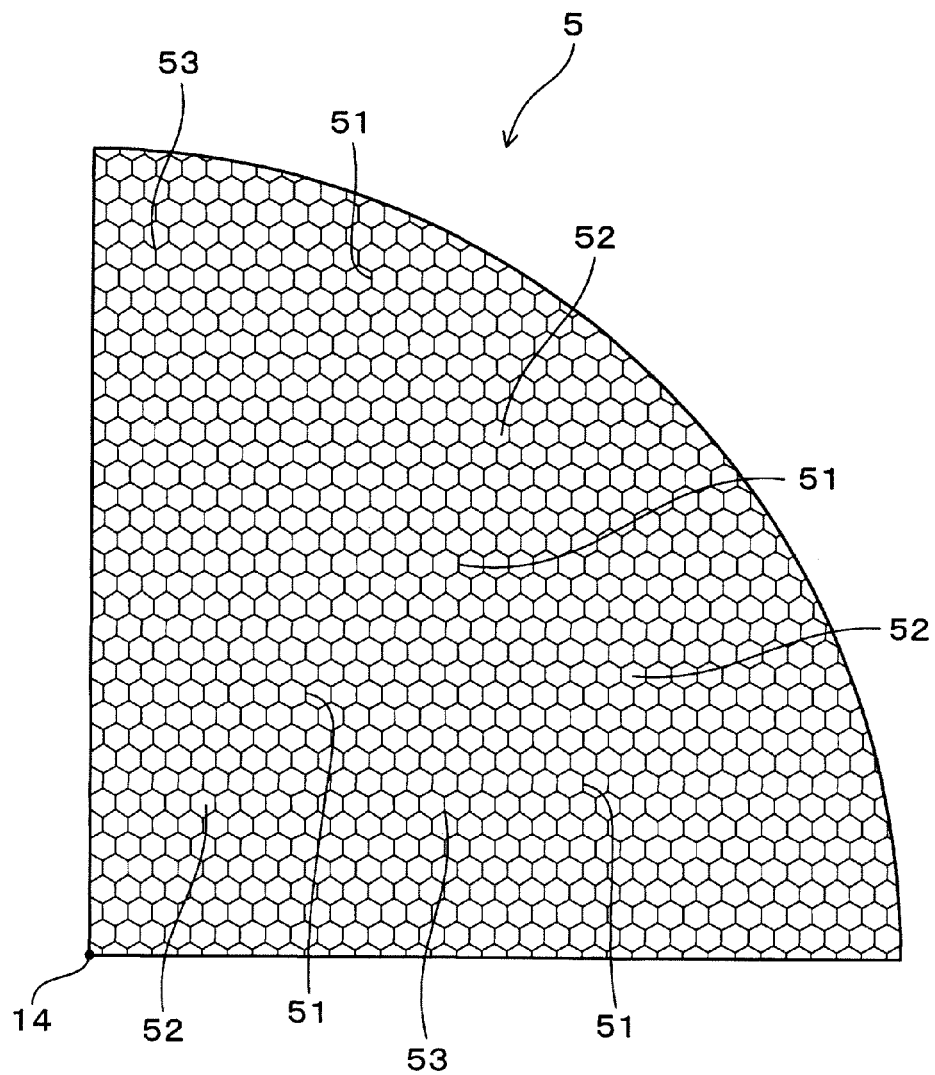
FIG. 10 is a cross sectional view showing a structure of a base structure body to be used in the third exemplary embodiment of the present invention.

FIG. 9 is a cross sectional view showing a structure of the honeycomb structure body 1 according to the third exemplary embodiment. FIG. 10 is a cross sectional view showing a structure of the virtual base structure body to be used for designing the honeycomb structure body 1 according to the third exemplary embodiment.

As shown in FIG. 9 and FIG. 10, the honeycomb structure body 1 according to the third exemplary embodiment has a structure obtained by modifying the structure of the honeycomb structure body 1 according to the second exemplary embodiment shown in FIG. 7 and FIG. 8. That is, the first cell density varying section 2 is formed in the overall area having the radius Rm measured from the central point 14 to the outermost periphery of the honeycomb structure body 1. A cell density of the cells formed in the cell density varying section 2 varies. That is, the first cell density varying section 2 is formed across the area, or throughout the area of the honeycomb structure body 1 and has a cell density which is different from that of the cell density varying section 2 in the honeycomb structure body 1 according to the second exemplary embodiment.

In particular, the virtual base structure body 5 shown in FIG. 10 has the base cells 52 having a cell density of 46 cells/cm$^2$. Each of the base cells 52 has a hexagonal tubular shape.

In the first cell density varying section 2, the main intersecting point 13 is obtained by multiplying the radius vector r used by the base intersecting point 53 having the same radius vector r and a magnification value Z. The magnification value Z is obtained by the linear function of Z=ar+b.

Other components in the honeycomb structure body 1 according to the third exemplary embodiment have the same structure as those in the honeycomb structure body 1 according to the second exemplary embodiment. The explanation of the same components is omitted here for brevity. The honeycomb structure body 1 according to the third exemplary embodiment has the same action and effects of the honeycomb structure body 1 according to the first exemplary embodiment.

Fourth Exemplary Embodiment

A description will be given of the honeycomb structure body 1 according to a fourth exemplary embodiment.

Figure 11:
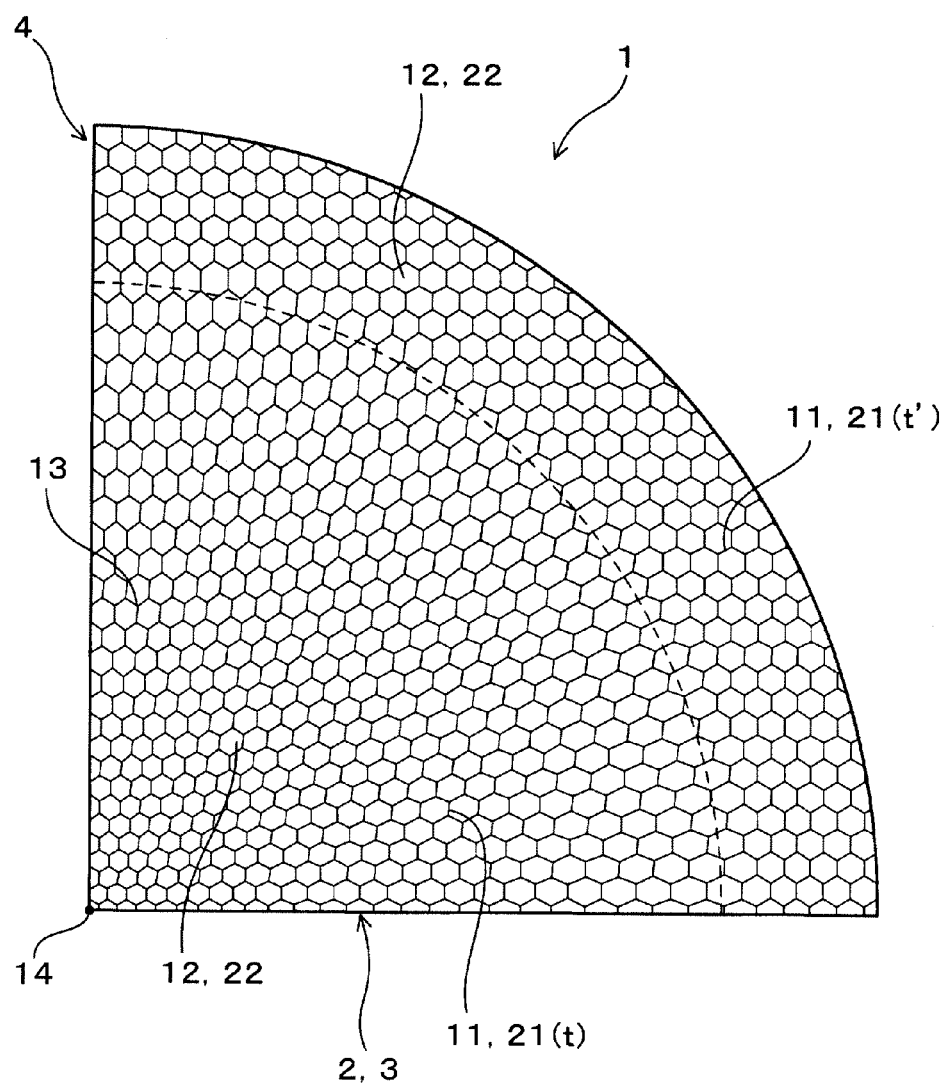
FIG. 11 is a cross sectional view showing a structure of a honeycomb structure body according to a fourth exemplary embodiment of the present invention.

FIG. 11 is a cross sectional view showing a structure of the honeycomb structure body according to the fourth exemplary embodiment. As shown in FIG. 11, the honeycomb structure body 1 according to the fourth exemplary embodiment has a structure which is a modification of the structure of the honeycomb structure body 1 according to the third exemplary embodiment shown in FIG. 9 and FIG. 10. As shown in FIG. 11, the honeycomb structure body 1 according to the fourth exemplary embodiment has the first cell density varying section 2 and a second cell density varying section 4. The second cell density varying section 4 is formed radially outside the first cell density varying section 2. In other words, the first cell density varying section 2 is formed radially inside the second cell density varying section 4. The radial direction is perpendicular to an axial direction of the honeycomb structure body 1.

The virtual base structure body 5 in the honeycomb structure body 1 according to the fourth exemplary embodiment shown in FIG. 11 has the same structure as that of the honeycomb structure body 1 according to the third exemplary embodiment shown in FIG. 10.

In the first cell density varying section 2 and the second cell density varying section 4, the main intersecting point 13 is obtained by multiplying the radius vector r used by the base intersecting point 53 having the same radius vector r and a magnification value Z. The magnification value Z is obtained by the linear function of Z=ar+b.

The second cell density varying section 4, which is formed radially outside the first cell density varying section 2, is formed between the outermost periphery of the first cell density varying section 2 and the outermost periphery of the honeycomb structure body 1. The second cell density varying section 4 is formed to increase a cell density of the main cells 12 from the central point 14 side to the radially outside direction. In addition, the main cells 12 in the second cell density varying section 4 around the outermost periphery of the honeycomb structure body 1 has a constant cell density. The main cells 12 have a shape and the cell density which are smaller than those in the virtual base structure body 5.

Other components in the honeycomb structure body 1 according to the fourth exemplary embodiment have the same structure as those in the honeycomb structure body 1 according to the third exemplary embodiment. The explanation of the same components is omitted here for brevity.

The honeycomb structure body 1 according to the fourth exemplary embodiment has the second cell density varying section 4, formed radially outside the first cell density varying section 2. The main cells 12 formed in the second cell density varying section 4 has a cell density which increases from the central point 14 side to the outermost periphery of the honeycomb structure body 1.

This structure makes it possible to increase the number of the main cell walls 11 in the second cell density varying section 4, and to increase the strength of the honeycomb structure body 1 according to the fourth exemplary embodiment.

It is also effective to increase the thickness of each of the main cell walls 11 in the second cell density varying section 4 in order to increase the strength of the honeycomb structure body 1.

It is preferable for the thickness t' of each of the main cell walls 11 to satisfy the relationship of $1.3 \text{ t} \leq \text{t1}$, where t indicates a thickness of each of the main cell walls 11 in the inside structure section 3 and the first cell density varying section 2. This structure makes it possible to increase the strength of the honeycomb structure body 1 without preventing a smooth flow of exhaust gas in the main cells 12 in the second cell density varying section 4.

In addition, it is preferable for the main cells 12 in a layer within a length of 4 mm measured in radial from the outermost periphery to have a constant cell density. Because external high stress is applied to the layer within approximately a length of 4 mm measured from the outermost periphery in the honeycomb structure body 1, it is possible to increase the strength of the honeycomb structure body 1 when the main cells 12 in this layer have a constant cell density.

The honeycomb structure body 1 according to the fourth exemplary embodiment has the same action and effects of the honeycomb structure body 1 according to the first exemplary embodiment.

Fifth Exemplary Embodiment

A description will be given of the honeycomb structure body 1 according to a fifth exemplary embodiment with reference to FIG. 12 and FIG. 13.

Figure 12:
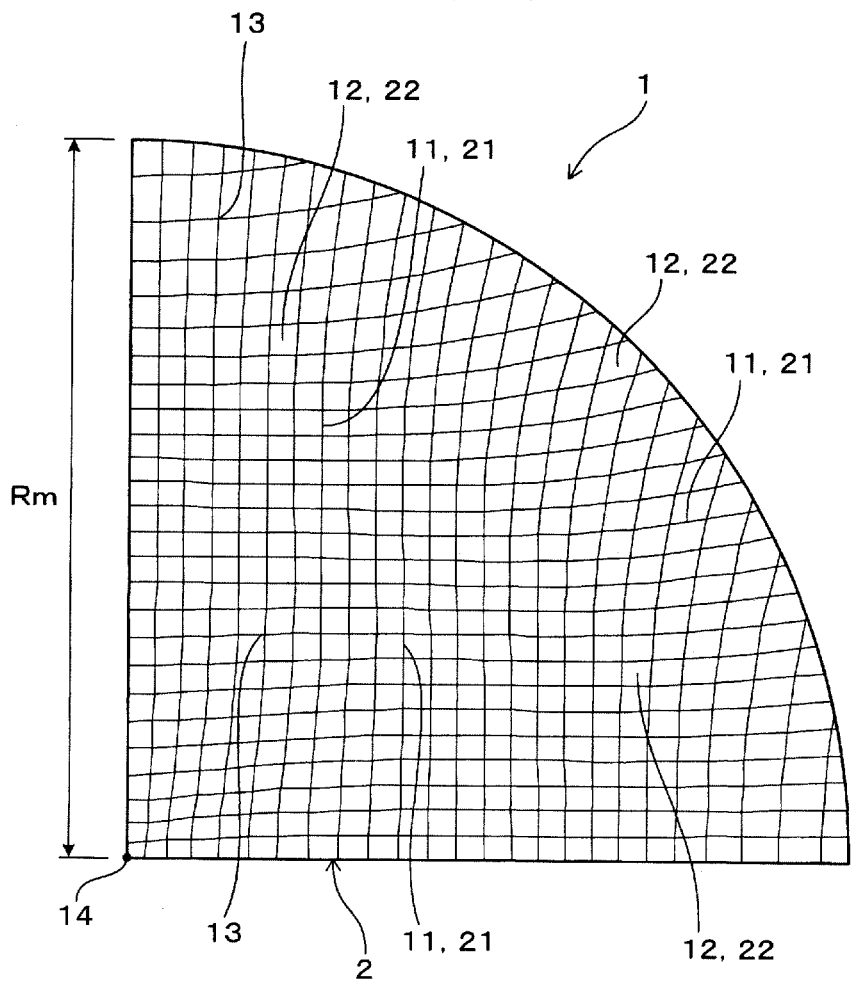
FIG. 12 is a cross sectional view showing a structure of a honeycomb structure body according to a fifth exemplary embodiment of the present invention.

FIG. 12 is a cross sectional view showing a structure of the honeycomb structure body 1 according to the fifth exemplary embodiment. FIG. 13 is a cross sectional view showing a structure of the virtual base structure body to be used in the fifth exemplary embodiment.

Figure 13:
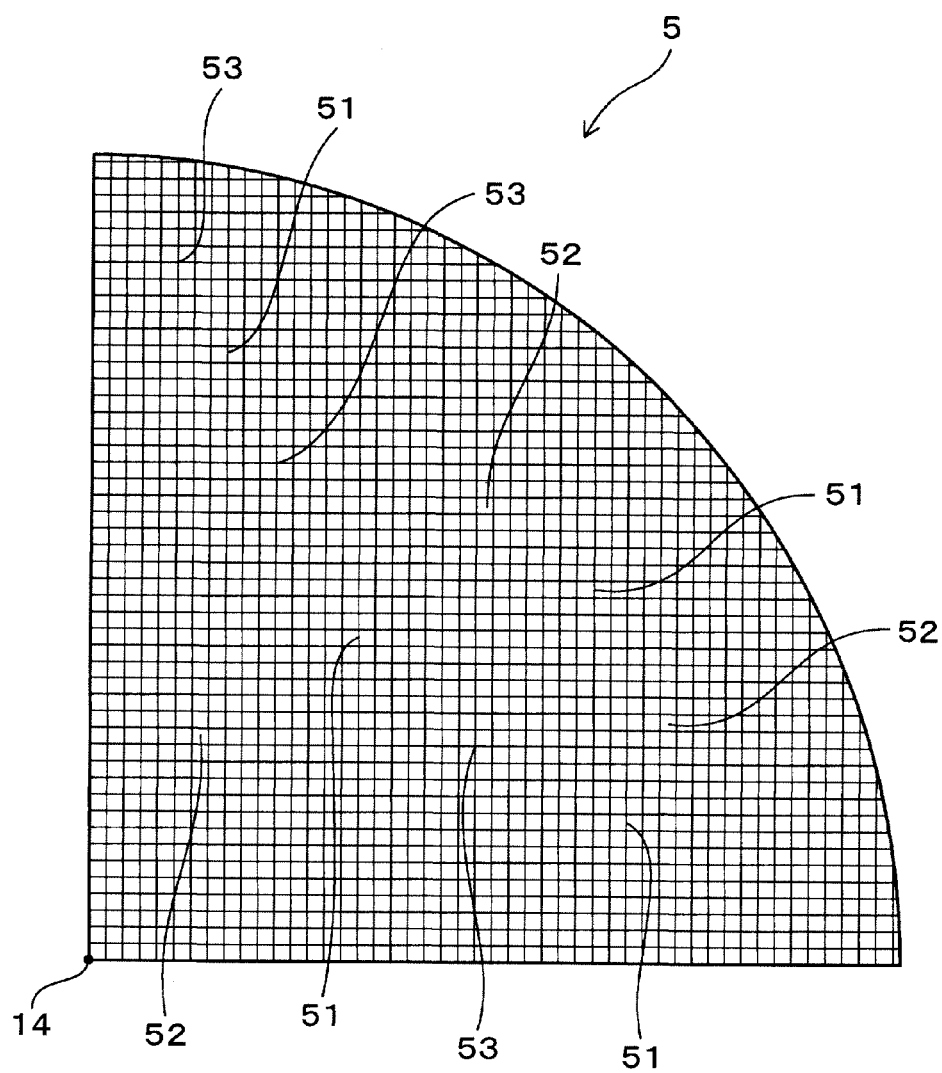
FIG. 13 is a cross sectional view showing a structure of a base structure body to be used in the fifth exemplary embodiment of the present invention.

The honeycomb structure body 1 according to the fifth exemplary embodiment shown in FIG. 12 and FIG. 13 has the cells 12, 22 and 32 which are different in shape from the cells 12, 22 and 32 used in the honeycomb structure body 1 according to the third exemplary embodiment shown in FIG. 9 and FIG. 10. That is, the honeycomb structure body 1 according to the fifth exemplary embodiment has the first cell density varying section 2 only. In other words, the overall cells 12 are formed in the first cell density varying section 2, i.e. across the area having the radius Rm measured from the central point 14 to the outermost periphery of the honeycomb structure body 1. In particular, the virtual base structure body 5 has the main cells 12 having a tubular square shape and the main cells 12 has a cell density of 93 cells/cm².

In the first cell density varying section 2, the main intersecting point 13 is obtained by multiplying the radius vector r used by the base intersecting point 53 having the same radius vector r and a magnification value Z. The magnification value Z is obtained by a cubic function of $Z=ar^3-br^2+cr-d$.

Other components in the honeycomb structure body 1 according to the fifth exemplary embodiment have the same structure as those in the honeycomb structure body 1 according to the first exemplary embodiment. The explanation of the same components is omitted here for brevity.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. A honeycomb structure body comprising:
   base cell walls; and
   base cells which allow exhaust gas to pass, each of which is surrounded by a corresponding group of the base cell walls so that a unit area in a cross section of the honeycomb structure body has a uniform cell density, the cross section of the honeycomb structure body is viewed perpendicular to an axial direction of the honeycomb structure body, the uniform cell density indicates the number of the base cells formed per unit area is constant,
   wherein
   a polar coordinate system indicates each of base intersecting points at which the base cell walls cross each other when viewed from the cross section which is perpendicular to the axial direction of the honeycomb structure body, and the polar coordinate system is designated by using a deflection angle and a radius vector measured from a central point of the honeycomb structure body,
   main intersecting points are formed on a polar coordinate using a main radius vector and the deflection angle, where the main radius vector is obtained by multiplying the radius vector and a constant magnification without varying the deflection angle of the base intersecting points having a same radius vector, and
   main cell walls are formed, with which the main intersecting points corresponding to the base intersecting points are connected together,
   main cells holes are bounded by the main cell walls,
   wherein a first cell density varying section is formed in at least a part of the honeycomb structure body, where a cell density of the main cell holes in the first cell density varying section is reduced from the central point to an outer periphery side of the honeycomb structure body.

2. The honeycomb structure body according to claim 1, wherein the main radius vector of the main intersecting points in the polar coordinate is determined by a function using the radius vector of the base intersecting points in the polar coordinate.

3. The honeycomb structure body according to claim 1, wherein the honeycomb structure body satisfies a relationship of $R1-\delta <= R2 <= 1.05\ R1$,
   where an exhaust gas pipe comprises
      an upstream side pipe, and
      an arrangement pipe and a downstream side pipe, the honeycomb structure body is arranged in the arrangement pipe,
   wherein R1 indicates a radius of a flow passage of the upstream side pipe, δ indicates a thickness of a boundary area in which exhaust gas flows at a flow speed of not more than 99%, formed between the upstream side pipe and the exhaust gas when exhaust gas flows in the inside of the upstream side pipe, and R2 indicates a boundary radius of a boundary layer,
   wherein
   the arrangement pipe has a diameter which is larger than that of the upstream side pipe, the honeycomb structure body has an inside structure section and the first cell density varying section, and
   wherein the inside structure section has a constant cell density and is formed inside in a radius direction of the honeycomb structure body, the first cell density varying section is formed outside of the inside structure section in the radius direction of the honeycomb structure body, and the boundary layer is arranged between the inside structure section and the first cell density varying section.

4. The honeycomb structure body according to claim 1, further comprising a second cell density varying section in which the cell density of the main cells holes increases in a direction from the central point side to the outer periphery side of the honeycomb structure body.

5. A honeycomb structure body comprising:
a plurality of cells that have a tubular shape, that are configured to pass exhaust gas, and that include a plurality of cell walls, wherein
the plurality of cells comprises a plurality of base cells with base cell walls, the plurality of base cells has a uniform cell density per unit area in a cross section, the cross section is perpendicular to an axial direction of the plurality of base cells, the cell density indicates the number of the base cells per unit area, a polar coordinate system includes respective polar coordinates that indicate each base intersecting point at which the base cell walls cross each other when viewed from the axial direction of the plurality of base cells, and the respective polar coordinate is designated by using a deflection angle and a radius vector measured from a central point of the plurality of cells,
the plurality of cells comprise a plurality of main cells with a plurality of main cell walls, a first cell density varying section is formed in at least a part of the main cells, a cell density of the main cells in the first cell density varying section is reduced from an inner side to an outer periphery side of the honeycomb structure body, the polar coordinate system indicates each of main intersecting points at which the main cell walls cross each other when viewed from the axial direction of the plurality of base cells, and a respective polar coordinate of the main intersecting points includes a main radius vector and a respective value of the deflection angle, where the main radius vector includes a constant magnification to achieve the cell density of the main cells without varying the deflection angle.

* * * * *